United States Patent
Lan

(10) Patent No.: US 6,180,507 B1
(45) Date of Patent: Jan. 30, 2001

(54) METHOD OF FORMING INTERCONNECTIONS

(75) Inventor: Shih-Ming Lan, Hsinchu (TW)

(73) Assignee: United Silicon Incorporated, Hsinchu (TW)

( * ) Notice: Under 35 U.S.C. 154(b), the term of this patent shall be extended for 0 days.

(21) Appl. No.: 09/206,052

(22) Filed: Dec. 4, 1998

(30) Foreign Application Priority Data

Oct. 14, 1998 (TW) .................................................. 87117030

(51) Int. Cl.$^7$ ................................................ H01L 21/4763
(52) U.S. Cl. ........................ 438/618; 438/624; 438/622; 438/637; 257/758; 257/760; 257/637; 257/639; 257/640
(58) Field of Search ..................................... 438/624, 639, 438/622, 623, 637, 702, 618; 257/758, 637, 639, 640, 760

(56) References Cited

U.S. PATENT DOCUMENTS

| 5,103,288 | * | 4/1992 | Sakamoto et al. | 357/71 |
| 5,461,003 | * | 10/1995 | Havemann et al. | 437/187 |
| 5,470,802 | * | 11/1995 | Gnade et al. | 437/238 |
| 5,472,913 | * | 12/1995 | Havemann et al. | 437/195 |
| 5,482,894 | * | 1/1996 | Havemann | 438/624 |
| 5,488,015 | * | 1/1996 | Havemann et al. | 437/195 |
| 5,494,858 | * | 2/1996 | Gnade et al. | 437/231 |
| 5,650,360 | * | 7/1997 | Tomita | 438/624 |

\* cited by examiner

*Primary Examiner*—Matthew Smith
*Assistant Examiner*—Belur Keshavan
(74) *Attorney, Agent, or Firm*—Jiawei Huang; J.C. Patents

(57) ABSTRACT

A method of forming interconnections is provided. A defined metal layer is formed as a metal line on a provided substrate. An oxide layer is formed on the metal layer and on the substrate. A silicon nitride layer is formed on the oxide layer. The oxide layer and the silicon nitride layer constitute a seed layer. A via hole is formed in the silicon nitride layer to expose the oxide layer positioned over the metal layer. A dielectric layer is formed on the seed layer. Since the silicon nitride layer and the oxide layer are different, a part of the dielectric layer positioned on the silicon nitride layer is a silicon oxide layer having holes therein. The other dielectric layer positioned on the oxide layer within the via hole is a dense silicon oxide layer.

17 Claims, 4 Drawing Sheets

METHOD OF FORMING INTERCONNECTIONS

CROSS-REFERENCE TO RELATED APPLICATION

This application claims the priority benefit of Taiwan application Ser. No. 87117030, filed Oct. 14, 1998 the full disclosure of which is incorporated herein by reference.

BACKGROUND OF THE INVENTION

1. Field of the Invention

The invention relates in general to a method of forming semiconductor integrated circuits (ICs), and more particularly to a method of forming interconnections.

2. Description of the Related Art

Increasing integration of an integrated circuit (IC) device results in insufficient wafer surface for formation of desired interconnects. In accordance with a need of interconnects in a metal-oxide semiconductor (MOS) transistor that has a highly reduced dimension, an interconnect structure is necessarily designed to include at least two metal layers. These multiple metal layers are usually insulated and held by inter-metal dielectric (IMD) layers in between them. According to designed circuit architecture, these metal layers have to be electrically coupled together at certain places. A via structure formed in the IMD layer is employed for this purpose of coupling. The via structure typically includes a via hole and a conductive via plug to fill the via hole. These two metal layers on both sides of the IMD layer are electrically coupled through the conductive via plug.

FIGS. 1A to 1E are schematic, cross-sectional views, illustrating a conventional fabrication process of a interconnection. In FIG. 1A, a substrate 100 having a device structure thereon is provided. A defined metal layer 102 as a metal line is formed on the substrate 100.

In FIG. 1B, a dielectric layer 106 is formed on the substrate 100 and on the defined metal layer 102. A planarization process is performed on the dielectric layer 106 to obtain a planar surface on the dielectric layer 106. A material of the dielectric layer 106 is silicon oxide with a dielectric constant of about 4–4.9.

In FIG. 1C, the dielectric layer 106 is defined to form a via hole 108 in the dielectric layer 106 using the metal layer 102 as an etching stop layer. A conformal barrier/glue layer 107 is formed on the dielectric layer 106.

In FIG. 1D, a conductive layer 110 is formed on the barrier/glue layer 107. The barrier/glue layer 107 enhances the adhesion between the conductive layer 110 and the dielectric layer 106. The conductive layer 110 fills the via hole 108 to form a metal plug electrically coupling with the metal layer 102. A planarization process is performed to planarize the conductive layer 110.

In FIG. 1E, the conductive layer 110 and the barrier/glue layer 107 are defined to form a wiring line 110a. An interconnection is thus completed.

The metal layer 102, the dielectric layer 106 and the conductive layer 110 constitute a capacitor structure called "parasitic capacitor". Since the dielectric constant of the dielectric layer 106 is high, problems with the parasitic capacitor become more serious than before when the feature size is smaller and a distance between two metal lines is shorter than before. One of the problems is RC delay. Another of the problems is cross-talk between the metal lines. These problems decrease the performance of devices.

SUMMARY OF THE INVENTION

It is therefore an object of the invention to provide a method of forming interconnections to form a dielectric layer with a low dielectric constant. RC delay is thus reduced to enhance the operated rate of the devices. Cross-talk between metal lines is also prevented to enhance the quality of the devices.

The invention achieves the above-identified objects by providing a method of forming interconnections. A substrate is provided. A defined metal layer is formed as a metal line on the substrate. An oxide layer is formed on the metal layer and on the substrate. A silicon nitride layer is formed on the oxide layer. The oxide layer and the silicon nitride layer constitute a seed layer. A via hole is formed in the silicon nitride layer to expose the oxide layer positioned over the metal layer. A dielectric layer is formed on the seed layer. Since the silicon nitride layer and the oxide layer are different, a part of the dielectric layer positioned on the silicon nitride layer is a silicon oxide layer having holes therein. The other dielectric layer positioned on the oxide layer within the via holes is a dense silicon oxide layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
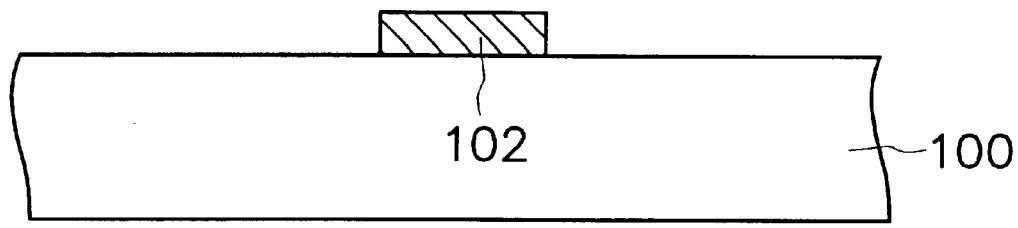
FIGS. 1A to 1E are schematic, cross-sectional views, illustrating a conventional fabrication process of a interconnection.
Figure 1B:
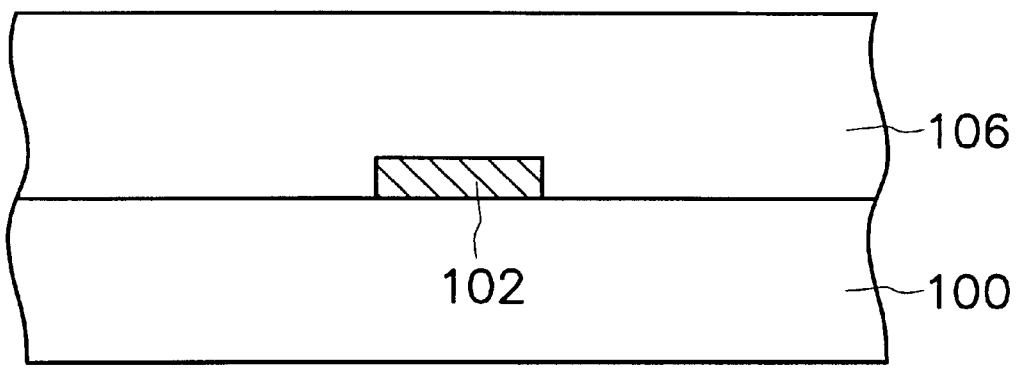
Figure 1C:
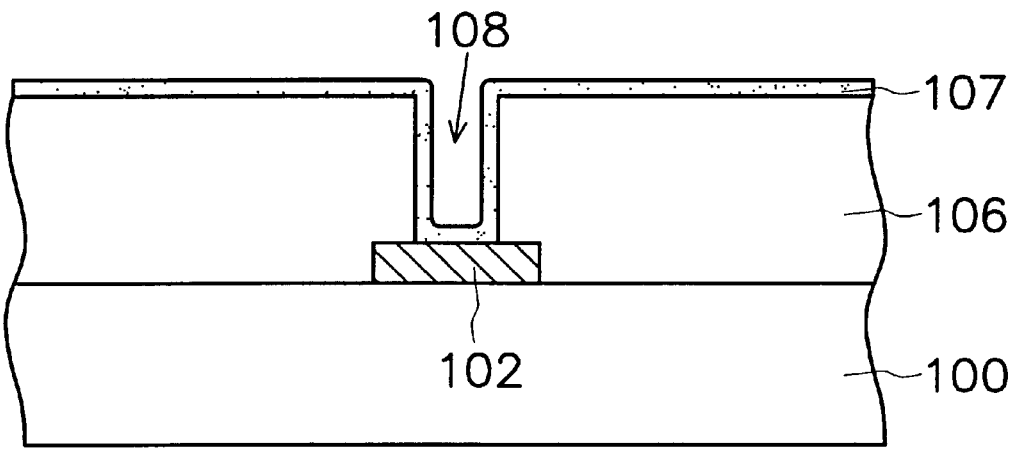
Figure 1D:
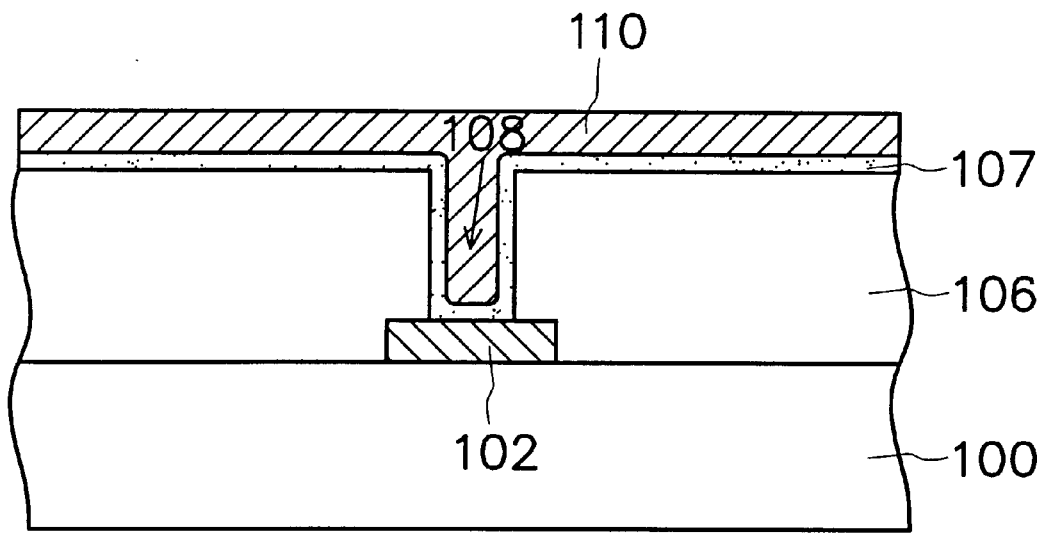
Figure 1E:
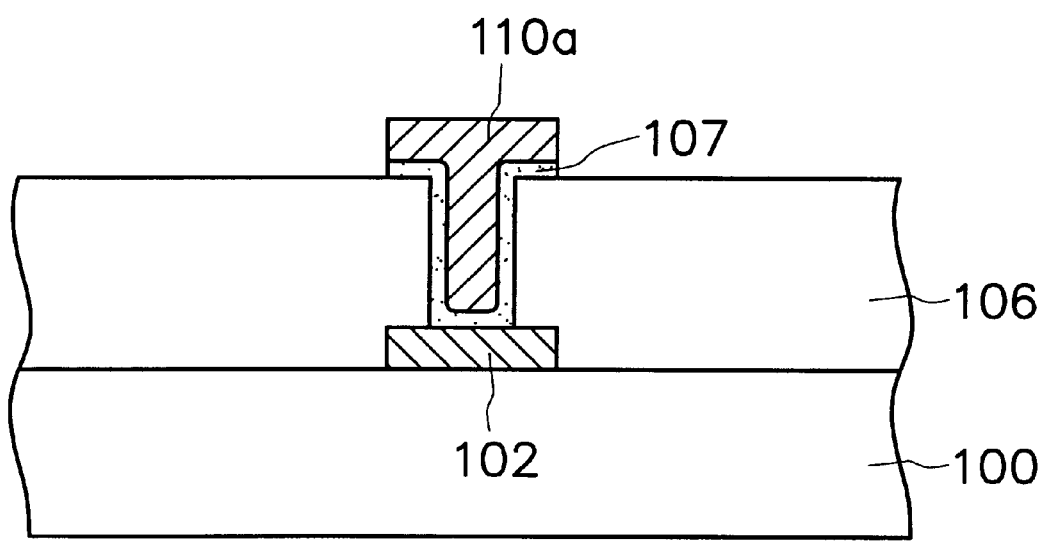
Figure 2A:
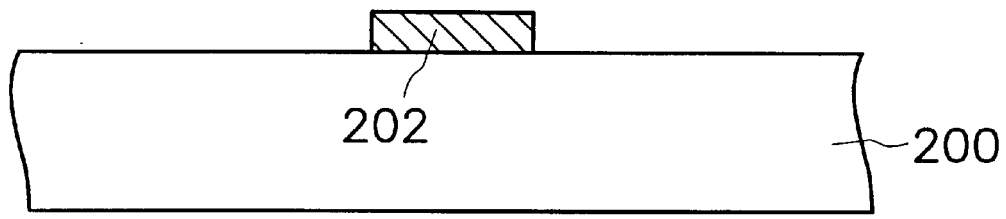
FIGS. 2A to 2F are schematic, cross-sectional views showing the process of one preferred embodiment of the method of forming interconnections.

In FIG. 2A, a substrate 200 is provided. The substrate 200 has a device structure (not shown) formed thereon. A defined metal layer 202 is formed as a metal line on the substrate 200. A preferred method for forming the defined metal layer 202 comprises steps of depositing a metal layer by chemical vapor deposition (CVD) or physical vapor deposition (PVD) and defining the metal layer by a photolithography and etching process to form the defined metal layer 202.

Figure 2B:
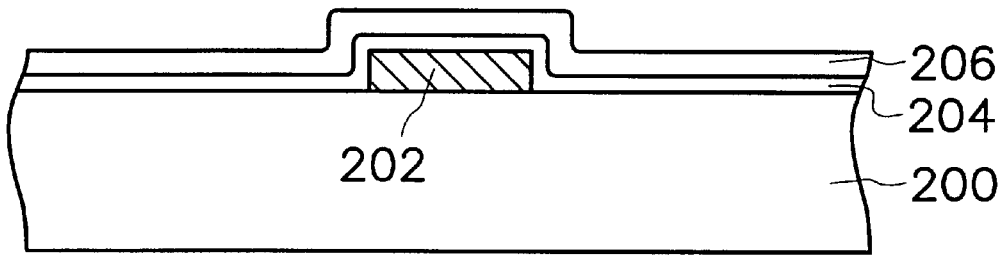

In FIG. 2B, a conformal first seed layer 204 is formed on the substrate 200 and on the defined metal layer 202. A preferred material of the first seed layer 204 comprises silicon oxide. A conformal second seed layer 206, such as a silicon-oxy-nitride layer or a silicon nitride layer, is formed on the first seed layer 204. A preferred method for forming the first seed layer 204 and the second seed layer 206 comprises CVD.

Figure 2C:
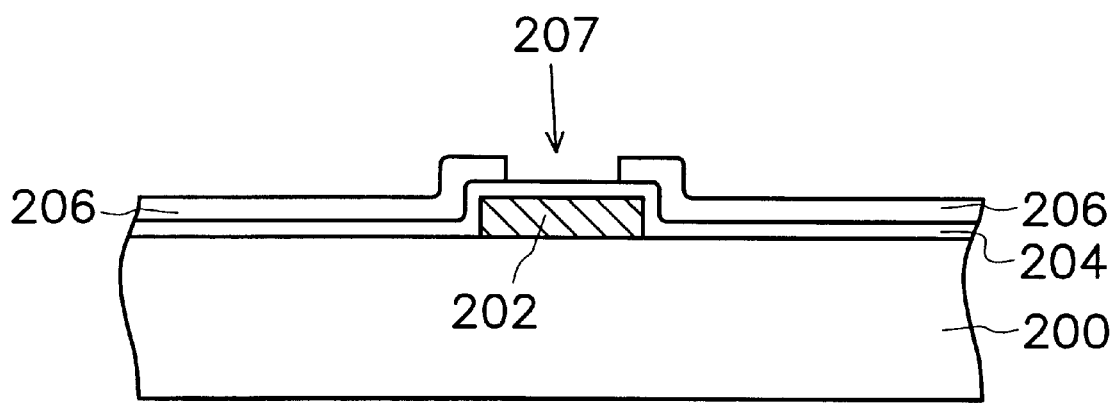

In FIG. 2C, the second seed layer 206 is defined to form an opening 207 to expose a part of the first seed layer 204 positioned over the metal layer 202.

Figure 2D:
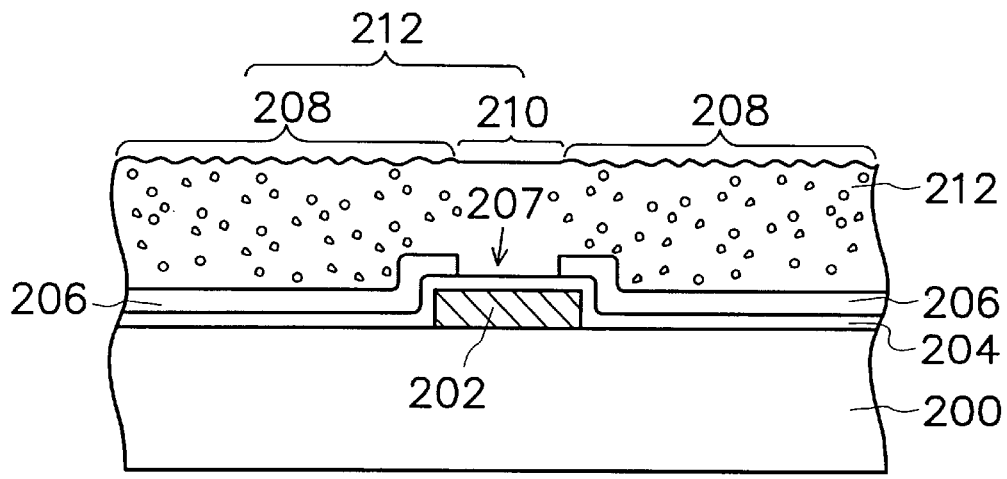

In FIG. 2D, a porous dielectric layer 212 is formed on the structure shown in FIG. 2C. A preferred method for forming the porous dielectric layer 212 comprises CVD using tetra-ethyl-ortho-silicate (TEOS), oxygen, ozone, nitrogen and helium as gas sources. The CVD process is performed at about 350–800° C. under a pressure of about 76–760 mmHg.

The porous dielectric layer 212 comprises two portions. One consists of porous silicon oxide. The other consists of dense silicon oxide. Since the first seed layer 204 and the second seed layer 206 have different characteristics, deposition of the dielectric layer 212 is affected by the first seed layer 204 and the second seed layer 206. The structure of the second seed layer 206 has Si—O—N bonding and Si—O—Si bonding. Silicon oxide deposits eclectically on the second seed layer 206 due to different bonding situations so that the porous silicon oxide 208 is thus formed. However, the first seed layer 204 is a silicon oxide layer so that silicon oxide deposited on the first seed layer 204 is a dense layer 210 without any holes.

The porous silicon oxide 208 is a major portion of the dielectric layer 21. Air in holes of the porous silicon oxide 208 has a dielectric constant of 1.00059. Because the silicon oxide layer 208 comprises silicon oxide and air, the dielectric constant of the silicon oxide layer 208 is between 1.00059 and 4.0–4.9 and is lower than the dielectric constant of a conventional silicon oxide layer.

Figure 2E:
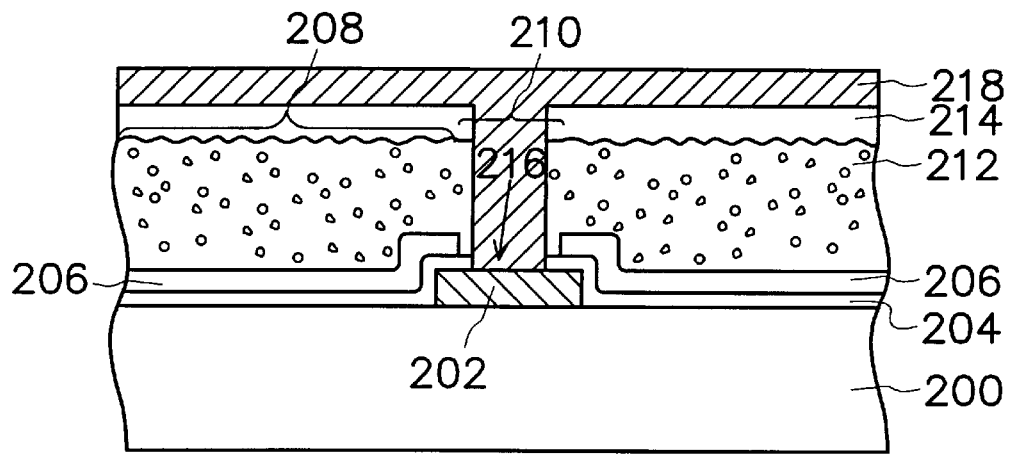
Figure 2F:
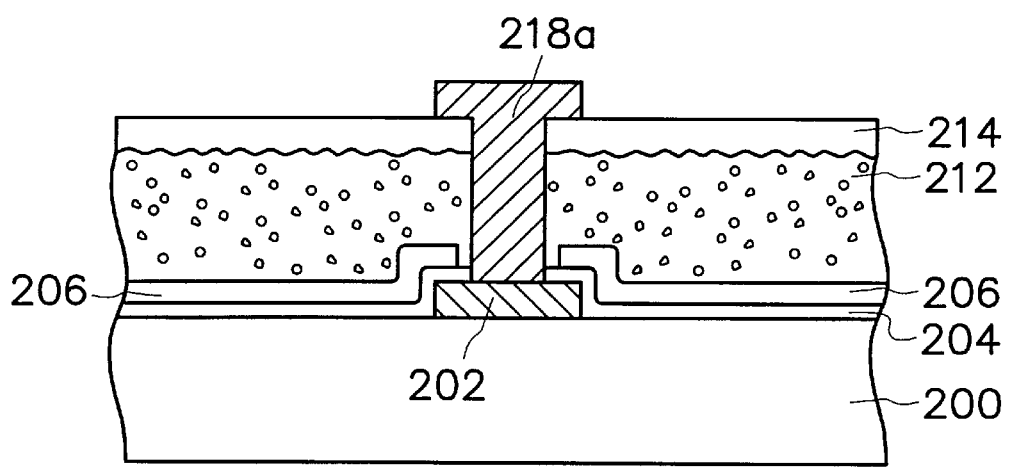

In FIG. 2E, a cap layer 214 is formed on the porous dielectric layer 212. A material of the cap layer 214 comprises silicon oxide, silicon nitride or silicon-oxy-nitride. A planarization process is performed to planarize the cap layer 214. Since the structure of the porous dielectric layer 212 is flimsy, the cap layer 214 is used to protect the dielectric layer 212. Furthermore, the cap layer 214 is used to obtain a planar surface and to achieve a predetermined thickness of the dielectric layer. The cap layer 214, the dense silicon oxide 210 and the first seed layer 204 positioned on the metal layer 202 are removed to form a via hole 216 to expose the metal layer 202. A conductive layer 218 is formed on the planarized cap layer and fills the via hole 216 to electrically couple with the metal layer 202. The conductive layer 218 is formed, for example, by sputtering. A planarization process is performed to planarize the surface of the conductive layer 218.e In FIG. 2F, the conductive layer 218 is defined to form a wiring line 218a on the cap layer 214.

A feature of the invention is that a porous dielectric layer having a lower dielectric constant than pure silicon oxide is formed to decrease RC delay and to enhance the operating rate of devices.

Another feature of the invention is that a dielectric material with low dielectric constant is provided to prevent cross-talk between metal lines to improve quality of the devices.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming interconnections, comprising the steps of:

provising a substrate, wherein the substrate has a defined metal layer thereon;

forming a conformal oxide layer on the substrate and covering the defined metal layer;

forming a seed layer on the conformal oxide layer;

forming an opening in the seed layer to expose a part of the conformal oxide layer positioned on the defined metal layer;

forming a porous dielectric layer on the seed layer;

forming a cap layer on the porous dielectric layer;

forming a via hole to expose the defined metal layer; and forming a defined conductive layer on the cap layer to electrically couple with the defined metal layer.

2. The method according to claim 1, wherein a material of the seed layer is selected from a group comprising silicon nitride and silicon-oxy-nitride.

3. The method according to claim 1, wherein the seed layer is formed by chemical vapor deposition.

4. The method according to claim 1, wherein the porous dielectric layer is formed by chemical vapor deposition.

5. The method according to claim 4, wherein the porous dielectric layer is deposited using a gas source comprising tetra-ethyl-ortho-silicate, oxygen, ozone, nitrogen and helium.

6. The method according to claim 4, wherein the porous dielectric layer is deposited at a temperature of abut 350–800° C.

7. The method according to claim 4, wherein the porous dielectric layer is deposited under a pressure of about 76–760 mmHg.

8. A method of forming interconnections, which is applied on a substrate having a defined metal layer thereon, comprising steps of:

forming a conformal first seed layer on the substrate and covering the defined metal layer;

forming a second seed layer on the first seed layer, wherein a part of the first seed layer positioned over the defined metal layer is exposed;

forming a porous dielectric layer on the second seed layer;

forming a via hole to expose the defined metal layer; and forming a conductive layer on the porous dielectric layer to electrically couple with the defined metal layer.

9. The method according to claim 8, wherein a material of the conformal first seed layer comprised silicon oxide.

10. The method according to claim 8, wherein a material of the second seed layer is selected from a group comprising silicon nitride and silicon-oxy-nitride.

11. The method according to claim 8, wherein the porous dielectric layer is formed by chemical vapor deposition.

12. The method according to claim 11, wherein the porous dielectric layer is deposited using a gas source comprising tetra-ethyl-ortho-silicate, oxygen, ozone nitrogen and helium.

13. The method according to claim 11, wherein the porous dielectric layer is deposited at a temperature of about 350–800° C.

14. The method according to claim 11, wherein the porous dielectric layer is deposited under a pressure of about 76–760 mmHg.

15. A method of forming a porous dielectric layer, comprising steps of:

forming a seed layer; and forming the porous dielectric layer on the seed layer using a gas source comprising tetra-ethyl-ortho-silicate, oxygen, ozone, nitrogen and helium, wherein the porous dielectric layer is deposited under a pressure of about 46–760 mmHg.

16. The method according to claim 15, wherein a material of the seed layer is selected from a group comprising silicon nitride and silicon-oxy-nitride.

17. The method according to claim 15, wherein the porous dielectric layer is deposited at a temperature of about 350–800° C.

* * * * *